(12) United States Patent
Damaraju et al.

(10) Patent No.: US 8,448,010 B2
(45) Date of Patent: May 21, 2013

(54) INCREASING MEMORY BANDWIDTH IN PROCESSOR-BASED SYSTEMS

(75) Inventors: Satish K. Damaraju, El Dorado Hills, CA (US); Subramaniam Maiyuran, Gold River, CA (US); Anupama Ambardar, Maricopa, AZ (US); Arindrajit Ghosh, Kolkata (IN)

(73) Assignee: Intel Corporation, Santa Clara, CA (US)

( * ) Notice: Subject to any disclaimer, the term of this patent is extended or adjusted under 35 U.S.C. 154(b) by 743 days.

(21) Appl. No.: 12/570,137

(22) Filed: Sep. 30, 2009

(65) Prior Publication Data
US 2011/0078485 A1    Mar. 31, 2011

(51) Int. Cl.
*G06F 1/04* (2006.01)
*G11C 8/16* (2006.01)

(52) U.S. Cl.
USPC .. 713/600; 713/500; 365/230.03; 365/233.13

(58) Field of Classification Search ............... 713/500, 713/600; 365/230.03, 233.13
See application file for complete search history.

(56) References Cited

U.S. PATENT DOCUMENTS

| | | | |
|---|---|---|---|
| 4,903,240 A * | 2/1990 | Von Flue | 365/189.02 |
| 6,240,038 B1 * | 5/2001 | Barry et al. | 365/230.06 |
| 7,623,404 B2 * | 11/2009 | Manickavasakam et al. | 365/226 |
| 2003/0076909 A1 * | 4/2003 | Greenhill et al. | 375/354 |
| 2003/0217244 A1 * | 11/2003 | Kelly | 711/168 |
| 2005/0144525 A1 * | 6/2005 | Heragu et al. | 714/30 |
| 2005/0195679 A1 * | 9/2005 | Faue et al. | 365/233 |
| 2006/0176751 A1 * | 8/2006 | Partsch et al. | 365/226 |
| 2008/0037357 A1 * | 2/2008 | Pelley et al. | 365/230.05 |

* cited by examiner

*Primary Examiner* — Kim Huynh
*Assistant Examiner* — Zahid Choudhury
(74) *Attorney, Agent, or Firm* — Trop, Pruner & Hu, P.C.

(57) ABSTRACT

The amount of data that may be transferred between a processing unit and a memory may be increased by transferring information during both the high and low phases of a clock. As one example, in a graphics processor using a general purpose register file as a memory and a mathematical box as a processing unit, the amount of data that can be transferred can be increased by transferring data during both the high and low phases of a clock.

14 Claims, 3 Drawing Sheets

INCREASING MEMORY BANDWIDTH IN PROCESSOR-BASED SYSTEMS

BACKGROUND

This relates generally to processor-based systems and, particularly, to techniques for increasing the bandwidth to and from memories associated with those processor-based systems.

A processor-based system is any system that uses a processing unit to execute instructions. The processing unit may be a controller, a central processor unit, a graphics processor, or a computer, as examples.

For example, in connection with processor-based systems, a graphics processor may be utilized to operate on graphical data. In some graphics processors, a graphics core may include execution units such as a mathematics box and an arithmetic logic unit. In order to increase the functionality of an execution unit, it may be desirable to increase the amount of data that may be handled by a memory, called a general purpose register file, to enable the execution unit to implement new functions.

DETAILED DESCRIPTION

In accordance with some embodiments, a memory that supplies data for a processing unit may be capable of higher bandwidth to enable the processing unit to perform more functions. In one example, the processing unit may be a processing unit of a graphics core of a graphics processor. However, the present invention is not necessarily limited to a particular processing unit or a particular memory.

In such a graphics processing core, at least two execution engines may be utilized, including a mathematics box and an arithmetic logic unit. The mathematics box may be dedicated to extended mathematics functions, such as log, sine, exponent, reciprocal, square, and the like. The mathematics box may include basic adders, shifters, and multipliers. The mathematics box functionality may be expanded, in one embodiment, to perform additional functions, such as single precision floating pointing addition, multiplication, and fused multiply-add (FMA) operations.

The arithmetic logic unit (ALU) may perform integer, floating point, and logical operations in one embodiment.

In order to increase the functions performed by a processing unit, such as a mathematics box as one example, the bandwidth of a memory that supplies data to the processing unit and which receives data from the processing unit may be increased. For example, a graphics processor may use a memory called a general purpose register file to supply data to the mathematics box and to receive data from the mathematics box. It is desirable, in some embodiments, to increase the bandwidth between the processing unit and a memory without adding ports or doubling frequencies.

Figure 1:
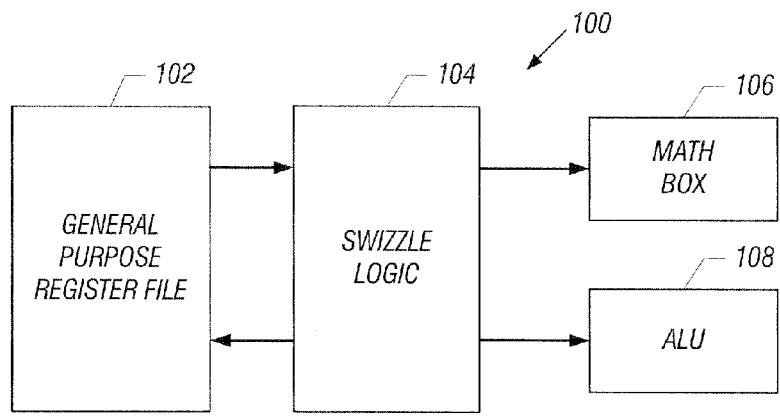
FIG. 1 is a schematic depiction of one embodiment of the present invention.

Thus, referring to FIG. 1, in accordance with one embodiment, a memory 102, such as a general purpose register file, is coupled by a bidirectional bus to swizzle logic 104. The swizzle logic may distribute data to and from the processing units that, in one embodiment, may be a mathematics box 106 and the arithmetic logic unit (ALU) 108. In some embodiments, a graphics core 100 may be part of a graphics processor integrated circuit.

Increasing the functionality of a processing unit, such as one of the execution engines 106 or 108, may create a need to increase the bandwidth of the memory 102. In one embodiment, the memory 102 may be an array of memory cells arranged in banks. Each bank may have a predetermined number of memory cells, such as 8, 16, or 32, coupled together through a local bit line. Each bank may include 8 word lines with four cells each, as one example. All the banks of the memory 102 may be tied together by a single global bit line in one embodiment.

During a read operation, one of the word lines of a bank of interest is on during the high phase of a clock signal and data is read out from a memory cell. In the low phase of that clock signal, the other banks stay idle while the selected bank pre-charges the selected bit line.

By making use of both phases of the clock, the read and write bandwidth of the memory 102 may be doubled. For example, during the high phase, a first set of 32 cells of a bank may be read, in an embodiment where a bank includes 32 cells. But, of course, other sizes of banks or numbers of cells per bank may be utilized. Then, during the low phase, read word lines from another bank of the remaining banks is read out. Generally, data is not read from the bank that was just read in the previous phase.

For example, if, during the high phase, cells of bank 0 data are read, in the low phase, bank 0 is not read again. Similarly, when writing to a bank, only that bank turns on while the others remain idle. Use of a writing technique, like the above described read technique, can double the write bandwidth.

Figure 2:
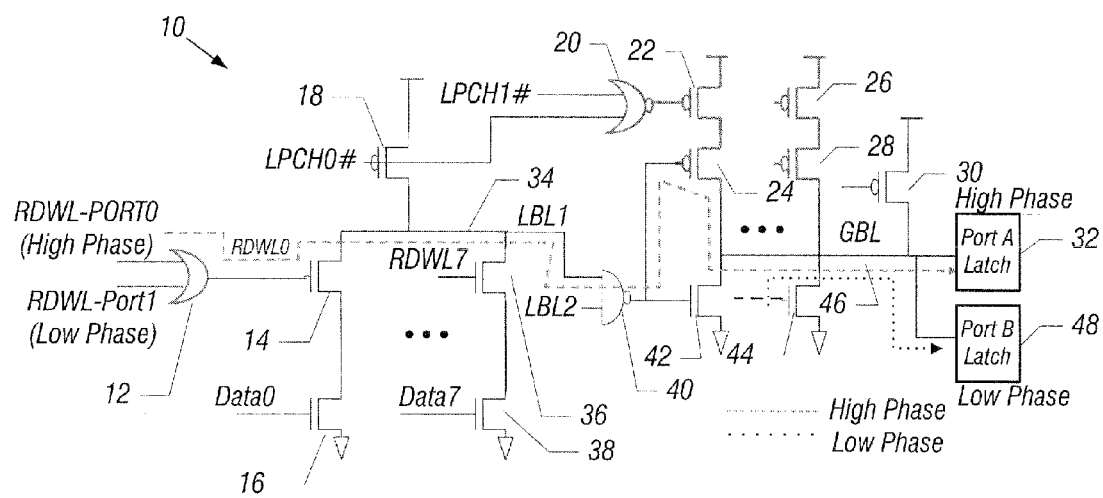
FIG. 2 is a schematic depiction of the read data path in accordance with one embodiment.

Referring to FIG. 2, a read data path 10 is depicted for the memory 102, according to one embodiment. The read data path includes a port 0 for the high phase read and a port 1 for the low phase read. Port 0 is associated with output latch port A 32 for the high phase. Likewise, port 1 for the low phase is associated with output latch 48, labeled port B. In the figure, the high phase data path is shown by dashed lines and the low phase data path is shown by dotted lines.

Initially, the port 0 and port 1 decoded signals are combined by an OR gate 12 and supplied to a transistor 14 or 36 for a selected word line. This supplies a read word line signal to the selected word line, which is labeled RDWL0 in this example. The selected word line (one of RDWL0-RDWL7) that is turned on is coupled to a local bit line LBL 34. In this example, each word line also has an enable signal, such as data 0 or data 7 coupled to a transistor 16 or 38.

Transistor 18 receives a low pre-charge signal LPCH0# (active low) for the local bit line LBL1. In one embodiment, each local bit line has 16 cells. There are two local bit lines per bank, each bank being connected to a global bit line. In one embodiment, there are four banks. The NOR gate 20 also receives the local pre-charge signal LPCH1# for the other local bit line, LBL2. The NAND gate 40 selects one of the two local bit lines (the local bit line LBL2 only shown at its connection to the gate 40) to be coupled to a global bit line GBL 46, in that embodiment.

Thus, during the high phase, the local bit line LBL1 is utilized for example, and in the low phase, the other local bit line LBL2 is utilized. Once the appropriate local bit line is selected, the output may be provided in the high phase on the port A latch 32 and in the low phase on the port B latch 48.

The p-channel transistors 22, 24, 26, and 28 allow a global bit line (GBL) to charge to the supply voltage when reading a zero from a memory cell. When a zero is read from a memory cell, the local bit line equals one, transistor 42 is off, and transistors 22 and 24 will be on, so the global bit line will be high. When a one is read from a memory cell, the local bit line is zero and transistor 42 is on, so the global bit line is low. The transistor 30 may be used to pre-charge the global bit line and the transistor 44 may be used to discharge the global bit line. Of course, other ways of reading the cell may also be used.

Figure 3:
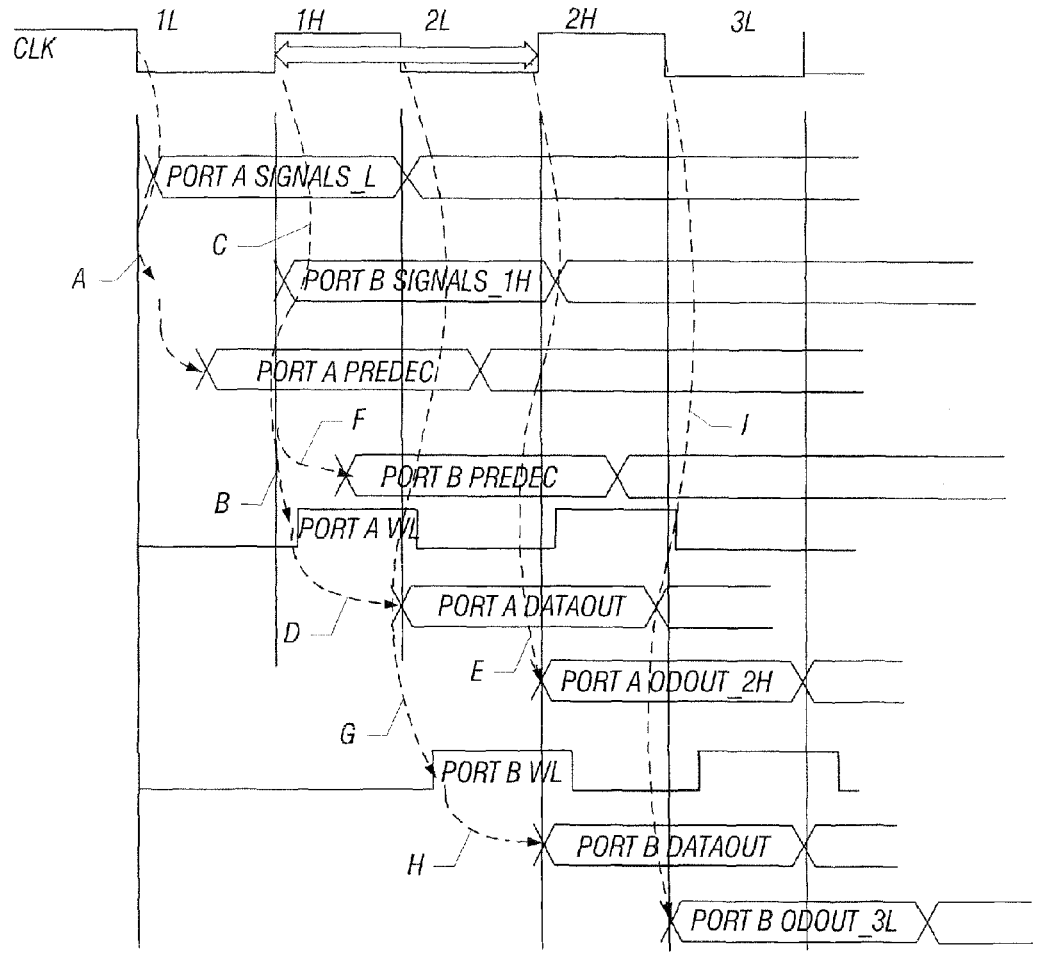
FIG. 3 is a timing diagram for the read data path in accordance with one embodiment.

The operation of the high phase is further illustrated in the timing diagram of FIG. 3, showing the first low phase of the clock, 1L, followed by the first high phase 1H, and then the next cycle includes low phase 2L and high phase 2H, and so on. During the first low phase signal 1L, the reading of port A signals begins. The first thing that is done is that the port A signals are pre-decoded, as indicated by the arrow A. After the port A signals are pre-decoded, the port A word line is activated, as indicated by arrow B, and the port B is pre-decoded, as indicated by arrow C, triggered from the leading edge of the first high phase-1H, of the clock (CLK). Next, the port A data out is activated, as indicated by arrow D, so that the data is provided through the port A latch 32, as indicated by arrow E, beginning at the leading edge of the 2H clock phase.

Similarly, during the first high signal, the reading of the port B signals begins, as indicated by the arrow F. During that first high phase 1H, the port B pre-decoding begins, as also indicated by arrow F. The port B pre-decoding is followed by the port B word line going high during the second low phase, as indicated by arrow G, and port B read out occurs during the second high phase, as indicated by arrow H. The port B data out occurs, as indicated by arrow I. This sequence continues from port A to port B, alternating back and forth.

Figure 4:
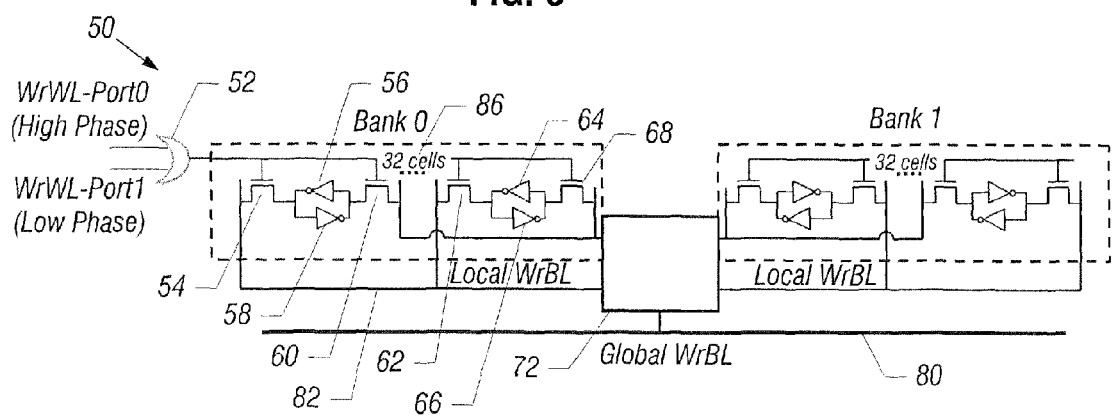
FIG. 4 is a schematic depiction of the write data path for one embodiment.

A write data path 50, for one embodiment, is shown in FIG. 4. The write word line is ORed at OR gate 52 between port 0 and port 1 decoded addresses. In the high phase, port 0 data is written for bank 0, in this example, and in the low phase, port 1 data is written for bank 1. The write data path 50 for each bank, such as the bank 0 or the bank 1, includes a local write bit line 82, coupled to a latch array 72, in turn coupled to a global bit line 80. The local write bit line is selected through a select transistor 54 or 62, coupled through cross coupled inverters 56 and the selection transistor 60 or 68. A plurality of cells in an array 86 may be coupled to the local write bit line. Each set of 16 cells is coupled throughout a local NAND gate to the local write bit line. The local NAND gate is made up of the transistors 54 and 60 and the cross coupled inverters 56 and 58 or 64 and 66.

In order to avoid minimum delay issues between the ports, the conventional write drivers are replaced with latches 72. A latch is opened in the same phase as a memory cell write. This overcomes the problem caused by a selected bit line toggling and consuming dynamic power. When a bit line is not being written, the latch may be closed. As a result, the unselected bit lines do not toggle, saving power.

A minimum delay problem arises when there is a write during the high phase in a cell and then in the low phase a latch is opened for the new write before the first write is completed. Separate latches may be used for the high and low phases to overcome this problem.

A conflict can occur if the same bundle is written in back-to-back writes. A bundle is all the cells connected to a local bit line. For example, in a system with 16 cells in a bank, that same bundle cannot be written in successive high and low cycles.

Figure 5:
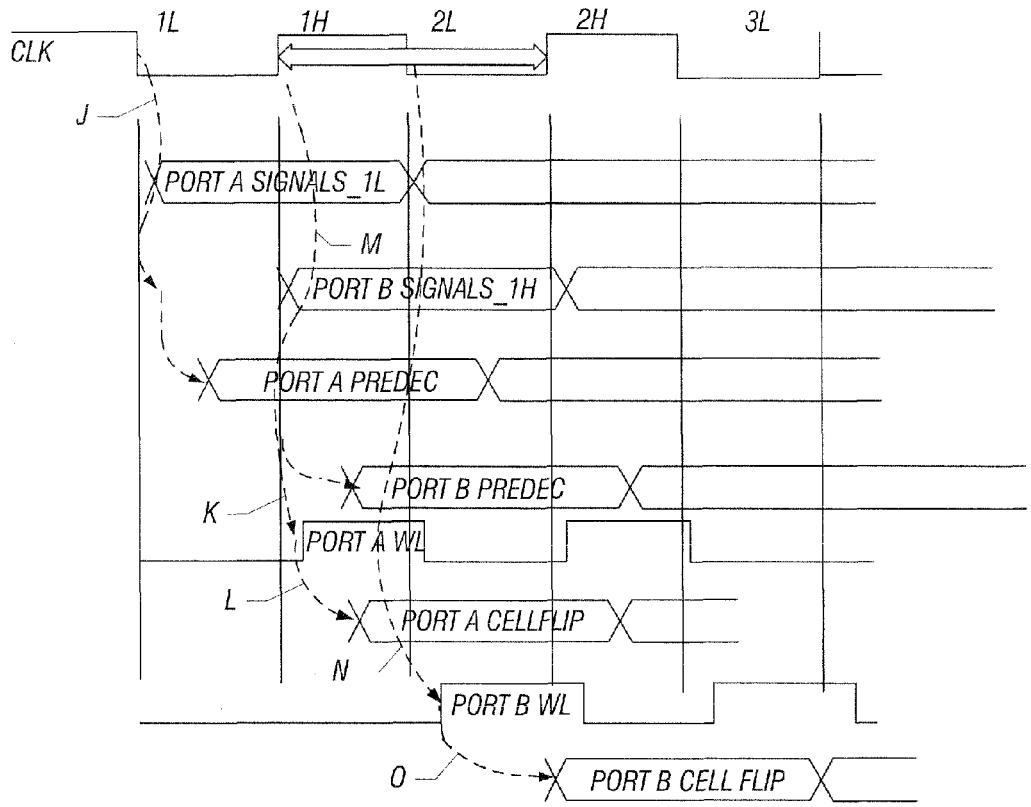
FIG. 5 is a timing diagram for the write data path in accordance with one embodiment.

Thus, referring to FIG. 5, a similar sequence occurs during write. In this case, the port A signal is triggered from the leading edge of the 1L phase, as indicated by the arrow J. This implements the port A pre-decode, as also indicated by the arrow J. The port A pre-decode initiates the port A word line going as indicated by the arrow K, which in turn results in the port A cell flip, as indicated by the arrow L. The timing diagram for port A "cell flip" corresponds to the actual writing of the information into the cell. Thus, port A is written during the first high cycle and port B is written during the second high cycle. The port A word line is addressed at the beginning of the first high cycle and the port B word line is activated in the beginning of the second low phase.

The port B signals trigger off the leading edge of the 1H clock phase, as indicated by the arrow M, followed by the port A pre-decode, also indicated by the arrow M, still on the 1H phase. The port B word line goes high in the 2L phase, as indicated by the arrow N, followed by the port B flip, as indicated by the arrow O. The port B cell flip is completed at the end of the 3L clock phase.

Figure 6:
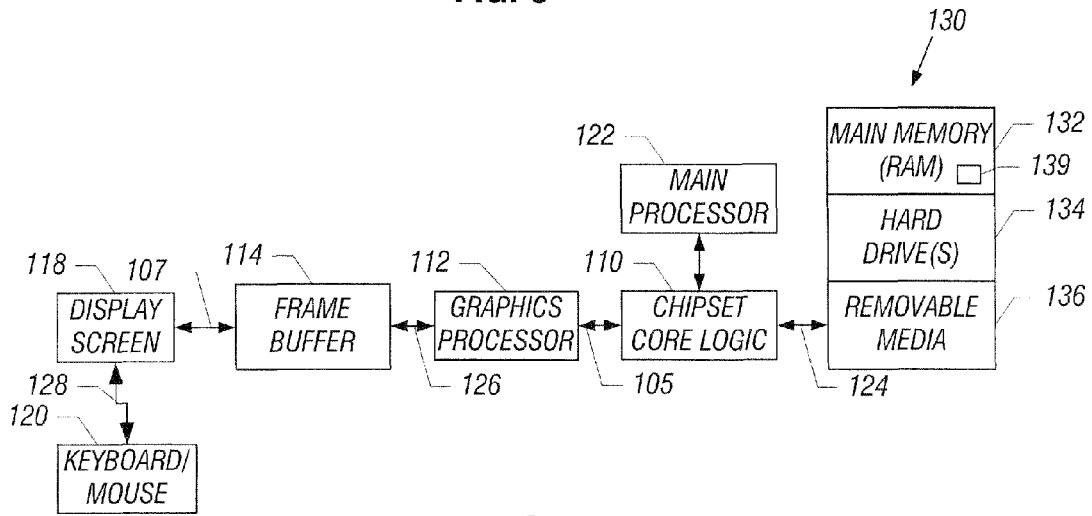
FIG. 6 is a system depiction in accordance with one embodiment.

A computer system 130, shown in FIG. 6, may include a hard drive 134 and a removable medium 136, coupled by a bus 124 to a chipset core logic 110. The core logic may couple to the graphics processor 112 (via bus 105) and the main or host processor 122 in one embodiment. The graphics processor 112 may also be coupled by a bus 126 to a frame buffer 114. The frame buffer 114 may be coupled by a bus 107 to a display screen 118, in turn coupled to conventional components by a bus 128, such as a keyboard or mouse 120.

In the case of a software implementation, the pertinent code may be stored in any suitable semiconductor, magnetic or optical memory, including the main memory 132. Thus, in one embodiment, code 139 may be stored in a machine readable medium, such as main memory 132, for execution by a processor, such as the processor 100 or the graphics processor 112. In one embodiment, the graphics core is part of the graphics processor 112.

In some embodiments, active power savings may be achieved because only the local bit lines to the bank of interest toggles. This is because write drivers are replaced with latches. If data is being written in bank 0, then only that latch turns on and the other latches, bank 1 in FIG. 4, will be in the off state.

The graphics processing techniques described herein may be implemented in various hardware architectures. For example, graphics functionality may be integrated within a chipset. Alternatively, a discrete graphics processor may be used. As still another embodiment, the graphics functions may be implemented by a general purpose processor, including a multicore processor.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising: transferring information between a processing unit and a memory during both the high and low phases of a clock, wherein the memory comprises a portion, wherein during any two consecutive phases of the clock, the portion can only be accessed once, latching any address lines that are not being addressed to avoid toggling and consuming dynamic power, using a first latch for data from a high phase write and a second latch for data from a low phase write, and dividing said memory into bundles, each bundle associated with a local bit line, a plurality of bundles associated with a global bit line, and avoid reading the same bundle in successive high and low phases.

2. The method of claim 1 including transferring information between a mathematical box and a general purpose register file during both the high and low phases of a clock.

3. The method of claim 1 including writing information to the memory during both the high and low phases of the clock.

4. The method of claim 1 including reading information from the memory during both the high and low phases of the clock.

5. The method of claim 1 including reading a first bank during a high phase of the clock and reading a second bank different from the first bank during a low phase of the clock.

6. The method of claim 5 including providing separate ports for each bank and using an OR gate to combine the signals for each port on the same address line.

7. The method of claim 6 including using the same address lines, but combining address ports for the low and high phase using an OR gate.

8. An apparatus comprising:
a memory having a portion;
a processing unit coupled to said memory;
said memory to read and write information during both the high and low phases of a clock, wherein during any two consecutive phases of the clock, said portion can only be accessed once;
a latch to latch any address line that is not being addressed in order to avoid toggling and consuming excessive dynamic power;
a first latch for data from the high phase "write and a second latch for data from a low phase write; and
said memory is divided into bundles, each bundle associated with a local bit line and a plurality of bundles associated with a global bit line, said memory to avoid reading the same bundle in successive high and low phases.

9. The apparatus of claim 8 wherein said memory is a general purpose register file.

10. The apparatus of claim 9 wherein said processing unit is a mathematical box.

11. The apparatus of claim 8 wherein said apparatus is a graphics processor.

12. The apparatus of claim 8 wherein said memory includes at least two banks of memory cells, said memory to read a first bank during a high phase of the clock and a second bank different from the first bank during the low phase of the clock.

13. The apparatus of claim 12 wherein said memory includes separate ports for each bank and an OR gate to combine the signals for each port on the same address line.

14. The apparatus of claim 13, said memory including an OR gate to combine address ports for the low and high phase.

* * * * *